United States Patent
Katayama et al.

(10) Patent No.: US 6,828,555 B2
(45) Date of Patent: Dec. 7, 2004

(54) THREE-DIMENSIONAL STRUCTURE VERIFICATION SUPPORTING APPARATUS, THREE-DIMENSIONAL STRUCTURE VERIFICATION METHOD, RECORDING MEDIUM, AND PROGRAM THEREFOR

(75) Inventors: Eisaku Katayama, Tokyo (JP); Norio Baba, Tokyo (JP)

(73) Assignee: Center for Advanced Science and Technology Incubation, Ltd., Tokyo (JP)

( * ) Notice: Subject to any disclaimer, the term of this patent is extended or adjusted under 35 U.S.C. 154(b) by 0 days.

(21) Appl. No.: 10/612,820

(22) Filed: Jul. 2, 2003

(65) Prior Publication Data

US 2004/0069946 A1 Apr. 15, 2004

Related U.S. Application Data

(63) Continuation of application No. PCT/JP01/10778, filed on Dec. 10, 2001.

(30) Foreign Application Priority Data

Jan. 5, 2001 (JP) .................................. 2001-000752

(51) Int. Cl.$^7$ ................................................ H01J 37/26
(52) U.S. Cl. .................. 250/311; 250/306; 250/396 R; 703/6; 378/43
(58) Field of Search .......................... 250/311, 306, 250/396 R; 703/6; 378/43

(56) References Cited

U.S. PATENT DOCUMENTS 6,051,834 A    4/2000  Kakibayashi et al.
6,349,273 B1 *  2/2002  Shinzawa ..................... 703/6

FOREIGN PATENT DOCUMENTS

EP    0 919 956 A2    6/1999
JP    62-219075    9/1987
JP    4-70983    3/1992
JP    7-98215    4/1995
JP    2001-312717    11/2001

OTHER PUBLICATIONS

Patent Abstracts of Japan, Publication No. 07–098215 dated Apr. 11, 1995, 1 pg.
Patent Abstracts of Japan, Publication No. 04–070983 dated Mar. 5, 1992, 1 pg.
Patent Abstracts of Japan, Publication No. 62–219075 dated Sep. 26, 1987, 1 pg.
Patent Abstracts of Japan, Publication No. 2001–312717 dated Nov. 9, 2001, 1 pg.
PCT International Preliminary Examination Report dated Sep. 19, 2002 (4 pgs.).
Japanese Office Action for Appliction No. 2002–556845, dated May 11, 2004, 2 pages, with Literal Translation from Japanese to English, 2 pages.
Baba, Norio, Stereo Prospect and Three Dimensional Measurement Method, Cell Engineering, Shyujunsha Co., Ltd., published on Feb. 1, 1998, vol. 17, No. 2, P272–283, with Partial Translation, 1 page.

* cited by examiner

*Primary Examiner*—John R. Lee
*Assistant Examiner*—Zia R. Hashmi
(74) *Attorney, Agent, or Firm*—Osha & May L.L.P.

(57) ABSTRACT

Verification of properness of a modeling theory of an uncrystallized substance or an image processing method is made easy. There includes: a first displaying unit 120 for rotationally displaying a simulated three-dimensionally shaded model image, which is a shaded image of the three-dimensional reconstruction image; and a second displaying unit 140 for displaying the three-dimensional image of the substance acquired by experimental structural analysis, which synchronously rotates with the simulated three-dimensionally shaded model image.

18 Claims, 11 Drawing Sheets

THREE-DIMENSIONAL STRUCTURE VERIFICATION SUPPORTING APPARATUS, THREE-DIMENSIONAL STRUCTURE VERIFICATION METHOD, RECORDING MEDIUM, AND PROGRAM THEREFOR

This is a continuation of application No. PCT/JP01/10778 filed Dec. 10, 2001.

TECHNICAL FIELD OF THE INVENTION

The present invention relates to an image processing apparatus, an image processing method, a storage medium, and a program. This patent application claims priority based on a Japanese patent application, 2001-752 filed on Jan. 5, 2001, the contents of which are incorporated herein by reference.

BACKGROUND ART

In order to settle structural analysis of a substance with high spatial resolving power, it is indispensable to apply a structural analysis method, such as X-ray diffraction or a multidimensional NMR method. In order to apply the X-ray diffraction to a certain substance, it is indispensable that the substance has to be firmly crystallized and the phase can be determined by isomorphous replacement or the like. Moreover, in order to apply the multidimensional NMR method to a certain substance, it is indispensable that the molecular weight of the substance is not so high and that a large quantity of high concentrated samples with high solubility is acquirable.

For a substance which does not fulfill the above-mentioned conditions, structural analysis of the substance has to be done with an electron microscope. However, it is difficult to analyze and determine the three-dimensional structure of single molecule by a widely used cryo-electron microscopic method because its contrast is low and the substance is damaged by irradiation of an electron beam.

In particular, in case that a plurality of molecules form a complex or in case that the structure is changing during performance of a certain function, even if the structure of each molecule is known, there is no means for analyzing properly how the plurality of molecules are arranged or how the molecular structure changes during performance of the function. In such a case, there is no choice but to build a virtual model presuming the most probable structure from existing circumstantial evidences. However, it has been impossible to verify the properness of the virtual model.

DISCLOSURE OF INVENTION

Therefore, it is an object of the present invention to solve such a problem.

According to a first aspect of the present invention, there is provided a three-dimensional structure verification supporting apparatus for supporting verification of an artificial three-dimensional structure by verifying properness of a three-dimensional simulated image simulated in order to indicate a three-dimensional structure of a substance. The three-dimensional structure verification supporting apparatus includes: a first displaying unit for displaying an simulated three-dimensionally shaded model image assumingly indicating the three-dimensional structure of the substance by shading the three-dimensional simulated image; and a second displaying unit for displaying the three-dimensional image of the substance acquired by experimental structural analysis, where the simulated three-dimensionally shaded model image and the experimental image rotate synchronously.

In the three-dimensional structure verification supporting apparatus of the first aspect, the second displaying unit may display the substance rotationally as if three-dimensional model rotates by sequentially displaying a plurality of shaded two-dimensional images in order of angle as the image, the images being acquired from a plurality of angles. In that case, the two-dimensional images may be gray-scale images acquired by a transmission electron microscope.

The simulated three-dimensionally shaded model image is acquired by processing a plurality of gray-scale image acquired by a transmission electron microscope.

The three-dimensional structure verification supporting apparatus may further include a three-dimensional image generating unit including: a shape simulating unit for simulating shape data indicating an outline of the substance using a plurality of first image data of the substance captured from a plurality of angles; a distributing unit for generating gray-scale density-distribution by extending density indicated in the gray-scale image to an angle by which the gray-scale image is captured, and distributing the density; a second integrating unit for generating a three-dimensional gray-scale data which indicates the substance by three-dimensional image data by integrating the plurality of gray-scale density-distribution by the plurality of gray-scale image acquired from a plurality of angles; a first integrating unit for integrating the three-dimensional gray-scale data by the second integrating unit on the shape data; and a data processing unit for generating the three-dimensional image by extracting only the gray-scale data existing in circumference of a shape indicated by the shape data among the three-dimensional gray-scale data.

The three-dimensional structure verification supporting apparatus may further include a three-dimensional image generating unit including: a shape simulating unit for simulating shape data indicating an outline of the substance using a plurality of first image data of the substance captured from a plurality of angles; and an image data generating unit for generating a three-dimensional simulated image by distributing the gray-scale data of the gray-scale image around the outline.

According to a second aspect of the present invention, there is provided a three-dimensional structure verification method of verifying a three-dimensional structure by verifying a three-dimensional simulated image simulated in order to indicate a three-dimensional structure of a substance. The three-dimensional structure verification method includes steps of: displaying an simulated three-dimensionally shaded model image, which is a shaded image of the three-dimensional simulated image, and an image acquired by an experimental structural analysis, with the images rotating synchronously; and verifying a three-dimensional structure by comparing the simulated three-dimensionally shaded model image with the experimental image.

In the three-dimensional structure verification supporting method of the second aspect, the image of the substance may be displayed rotationally as if three-dimensional model rotates by sequentially displaying a plurality of shaded two-dimensional images in order of angle as the image, the images being acquired from a plurality of angles. In that case, the two-dimensional images are gray-scale images acquired by a transmission electron microscope.

The simulated three-dimensionally shaded model image may be acquired by processing a plurality of gray-scale image acquired by a transmission electron microscope.

The three-dimensional structure verification method may further include steps of: simulating shape data indicating an outline of the substance using a plurality of first image data of the substance captured from a plurality of angles; generating gray-scale density-distribution by extending density indicated in the gray-scale image of the substance acquired by a projection image capturing apparatus to an angle by which the gray-scale image is captured, and distributing the density; generating three-dimensional gray-scale data which indicates the substance by three-dimensional image data by integrating the plurality of gray-scale density-distribution by the plurality of gray-scale image acquired from a plurality of angles; integrating the three-dimensional gray-scale data of the shape data; and generating the three-dimensional simulated image by extracting only the gray-scale data existing in circumference of an outline indicated by the shape data among the three-dimensional gray-scale data.

The three-dimensional structure verification method may further include steps of: simulating shape data indicating an outline of the substance using a plurality of first image data of the substance captured from a plurality of angles; and generating a three-dimensional simulated image by distributing the gray-scale data of the gray-scale image around the outline.

According to a third aspect of the present invention, there is provided a recording medium storing thereon a program for supporting verification of an artificial three-dimensional structure by verifying a three-dimensional simulated image simulated in order to indicate a three-dimensional structure of a substance. The program includes: a first displaying module for displaying an simulated three-dimensionally shaded model image, which is a shaded image of the three-dimensional simulated image; and a second displaying module for displaying the image of the substance acquired by experimental structural analysis, and the simulated three-dimensionally shaded model image and the experimental image rotate synchronously.

According to a fourth aspect of the present invention, there is provided a program for supporting verification of an artificial three-dimensional structure by verifying a three-dimensional simulated image simulated in order to indicate a three-dimensional structure of a substance. The program includes: a first displaying module for displaying an simulated three-dimensionally shaded model image, which is a shaded image of the three-dimensional simulated image; and a second displaying module for displaying the image of the substance acquired by experimental structural analysis, wherein the simulated three-dimensionally shaded model image and the experimental image rotate synchronously.

In the recording medium of the third aspect and in the program of the fourth aspect, the program may further include: a shape simulating module for simulating shape data indicating an outline of the substance using a plurality of first image data of the substance captured from a plurality of angles; a distribution module for generating gray-scale density-distribution by extending density indicated in the gray-scale image acquired by a transmission electron microscope to an angle by which the gray-scale image is captured, and distributing the density; a second integrating module for generating a three-dimensional gray-scale data which indicates the substance by three-dimensional image data by integrating the plurality of gray-scale density-distribution by the plurality of gray-scale image acquired from a plurality of angles, a first integrating module for integrating the three-dimensional gray-scale data by the second integrating unit on the shape data; and a data processing module for generating the three-dimensional image by extracting only the gray-scale data existing in circumference of a shape indicated by the shape data among the three-dimensional gray-scale data.

Moreover, the program may further include: a shape simulating module for simulating shape data indicating an outline of the substance using a plurality of first image data of the substance captured from a plurality of angles; and an image data generating module for generating a three-dimensional simulated image by distributing the gray-scale data of the gray-scale image acquired by a transmission electron microscope around the outline.

This summary of the invention does not necessarily describe all necessary features so that the invention may also be a sub-combination of these described features.

BEST MODE FOR CARRYING OUT THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
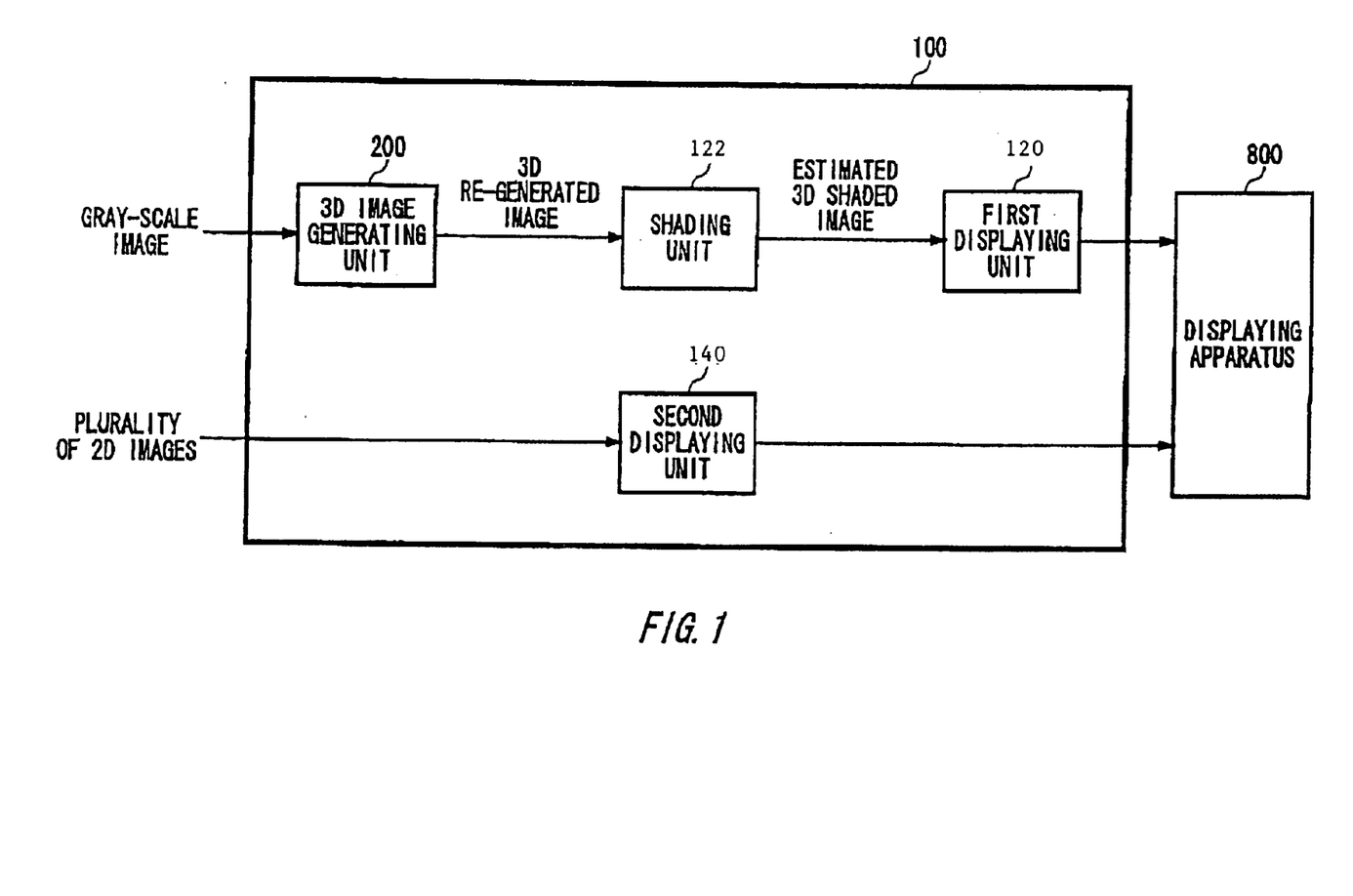
FIG. 1 is a block diagram showing a configuration of a three-dimensional structure verification supporting apparatus 100 according to an embodiment of the present invention.

FIG. 1 is a block diagram showing a three-dimensional structure verification supporting apparatus 100 according to an embodiment of the present invention. The three-dimensional structure verification supporting apparatus 100 includes a three-dimensional image generating unit 200, a first displaying unit 120 and a second displaying unit 140. The first displaying unit 120 includes a shading unit 122 and an angle specification unit 124. The three-dimensional structure verification supporting apparatus 100 computes a three-dimensional reconstruction image, which is an example of a three-dimensional simulated image, using the three-dimensional image generating unit 200 from gray-scale image, which is a projection image acquired by a projection image capturing apparatus such as a transmission electron microscope. Moreover, the three-dimensional structure verification supporting apparatus 100 translates the three-dimensional reconstruction image into an simulated three-dimensionally shaded model image, which indicates simulated three-dimensional structure of the substance by shading the three-dimensional reconstruction image, using the first displaying unit 120, causes a displaying apparatus 800 to indicate a rotatable image, and causes the displaying apparatus 800 to indicate a rotatable 3D image of the substance acquired by an experimental structural analysis, such as a transmission electron microscope, using the second displaying unit 140. That is, the three-dimensional structure verification supporting apparatus 100 is the apparatus for supporting the verification of the artificial three-dimensional structure by simultaneously displaying both the simulated three-dimensionally shaded model image and the image acquired by the experimental structural analysis, which are rotating through substantially the same angle as each other, so that the simulated three-dimensionally shaded model image and the experimental image are comparable and difference between them is easily detectable. Here, it is preferable that the simulated three-dimensionally shaded model image and the image acquired by the experimental structural analysis are displayed side by side.

Even if the resolution of the image acquired from the transmission electron microscope etc. is lower than expected, since the three-dimensional structure verification supporting apparatus 100 displays the rotating three-dimensional reconstruction image and the rotating image, it is possible to compare these two rotating images and to detect the difference between the three-dimensional reconstruction image and the experimental image.

The three-dimensional image generating unit 200 is the apparatus for acquiring three-dimensional data about the three-dimensional structure of a subject using first image data captured from a plurality of angles, and a plurality of projection image data acquired by the transmission electron microscope etc., i.e., gray-scale image. Here, the gray-scale image can be used as the first image data.

Figure 2:
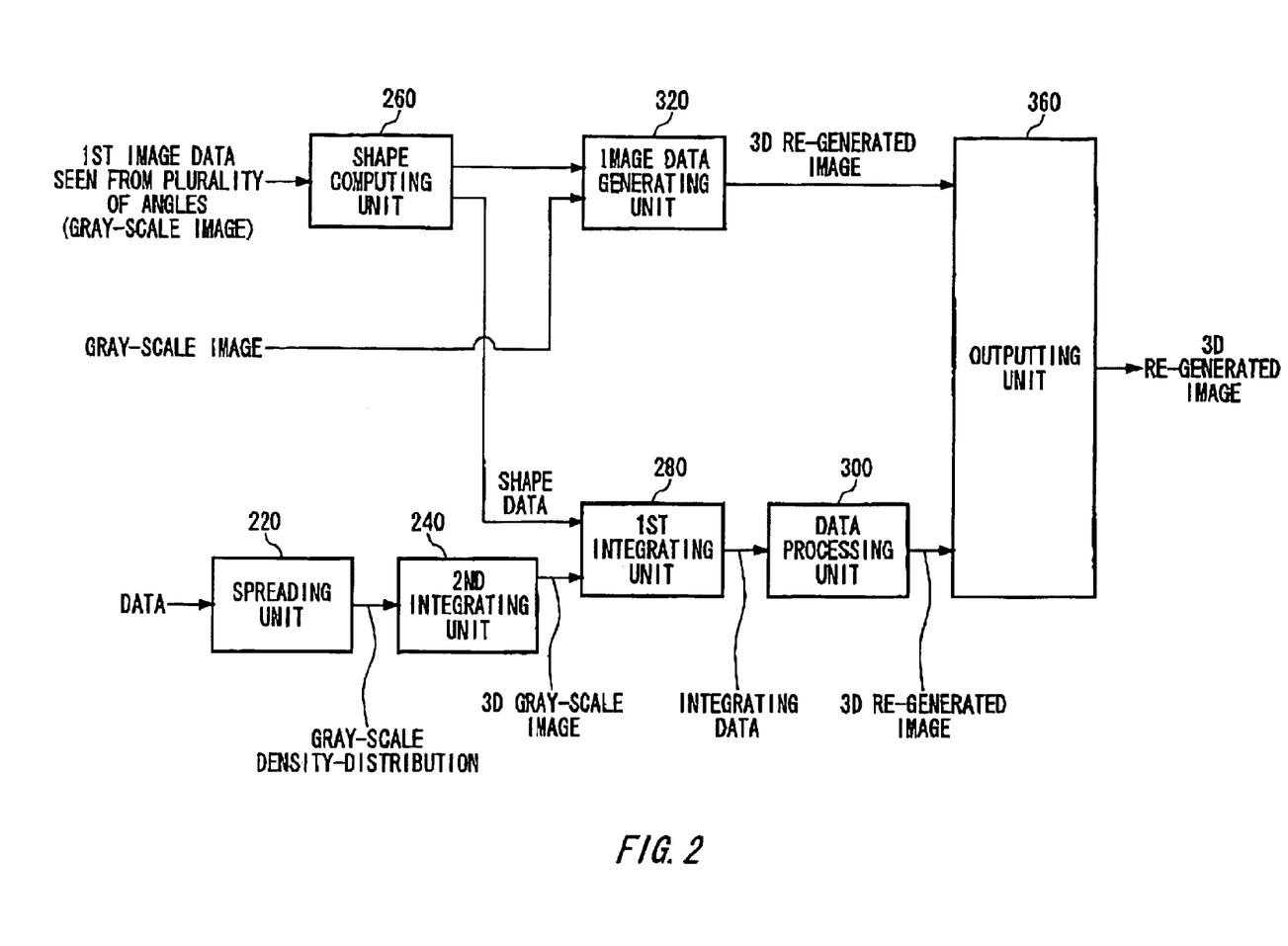
FIG. 2 is a block diagram showing a configuration of a three-dimensional image generating unit 200.

FIG. 2 is a block diagram exemplary showing a configuration of the three-dimensional image generating unit 200. In the present embodiment, the three-dimensional image generating unit 200 includes a distributing unit 220, a second integrating unit 240, a shape simulating unit 260, a first integrating unit 280, a data processing unit 300, an image data generating unit 320, and an outputting unit 360.

The distributing unit 220 generates gray-scale density-distribution by extending and distributing the plurality of gray-scale image acquired from exterior to a captured angle, i.e., a projected angle respectively, and outputs it to the second integrating unit 240. For example, the distributing unit 220 distributes gray-scale of the gray-scale image uniformly in the extending direction.

The second integrating unit 240 generates three-dimensional gray-scale data by integrating the plurality of gray-scale density-distribution by the distributing unit 220, with their angle being maintained, and outputs it to the first integrating unit 280. The generated three-dimensional gray-scale data becomes data indicating the subject with three-dimensional image data. Here, there is some possibility that false information is included in the three-dimensional gray-scale data.

The shape simulating unit 260 simulates height information on specific points of the subject, that is, processing objective points, from three or more image data captured from three or more angles, and simulates shape data which represents data which represent outline of the subject using the height information on a plurality of the processing objective points.

Figure 3:
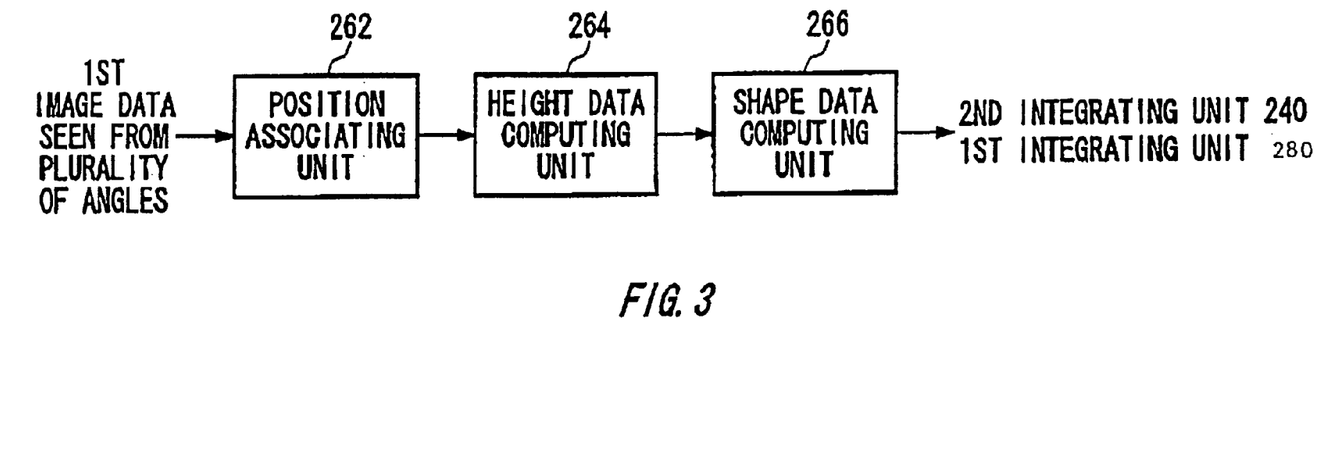
FIG. 3 is a block diagram showing a configuration of a shape simulating unit 260.

FIG. 3 shows an example of a configuration of the shape simulating unit 260. The shape simulating unit 260 includes a position relating unit 262, a height data computing unit 264, and a shape data computing unit 266.

The position relating unit 262 recognizes positions of a plurality of processing objective points in two set of the image data which is consecutive in the order of an angle, relates them respectively, and outputs them to the height data computing unit 264.

In detail, relating positions of the processing objective points in first image data and second image data, which are consecutive in order of angles, and relating positions of the processing objective points in the second image data and the third image data just next to the second in order of angles. This relating process is performed sequentially also to the other image combinations such as the third and fourth image data, and so on. Each of the processing objective points is related in 2 or more sets of image combination, respectively.

Moreover, the position relating unit 262 defines a base line in the image data, and measures distances of the base line and the processing objective points. When a difference of the distances from the base line to the processing objective points in two images, which constitute an image combination, is more than a predetermined level, the position relating unit performs again the position recognitions and the relations to the processing base line.

Here, the position relating unit relates the positions of processing objective points using the above mentioned predetermined angle when each of the images are captured with a rotation of the subject by the predetermined angle with the same rotation axis as the rotation center, or the first and second images among three or more image data, are captured with a rotation of the subject by a predetermined angle with a rotating axis as a rotating center, and the third image are captured with a rotation of the subject with another rotating axis as a rotating center, by the predetermined angle, from the position where the first image was captured.

A height data computing unit 264 calculates height information of the processing objective points related by the position relating unit 262 in two set of image data respectively, and outputs them to the shape data computing unit 266. The processing performed by the height data computing unit 264 is same as the so-called processing of a stereoscopic vision method. Here, since each of the processing objective points is related in at least 2 or more sets of image combination respectively, the height data computing unit 264 calculates two or more height information of each of the processing objective points. The height data computing unit 264 calculates height information which should be outputted by the least-squares error method based on a plurality of height information. When the error by the least-squares error method is more than a predetermined value, the position relating unit 262 re-detects the positions of processing objective points.

A shape data computing unit 266 calculates shape data of the subject using height information of the processing objective points which the height data computing unit 264 calculated, and plane information of the processing objective points calculated from the image data. The shape data computing unit 266 outputs the calculated shape data to the image data generating unit 320, the first integrating unit 280.

Returning to FIG. 2, the first integrating unit 280 generates an integrated image by integrating shape data by the shape simulating unit 260 on three-dimensional gray-scale data by the second integrating unit 240, and outputs the image to the data processing unit 300.

The data processing unit 300 generates three-dimensional reconstruction image data by extracting only information which exists around the shape data or information which laps with the shape data, from three-dimensional gray-scale density-distributions, using the integrated image which the first integrating unit 280 outputted, and outputs the three-dimensional reconstruction image data to the outputting unit 360. When the false information is included in the three-dimensional gray-scale data, there is no lapping between the false information and the shape data. Therefore, false information is not included in the information that the data process unit 300 extracts. Consequently, the three-dimensional reconstruction image data corresponds to information representing a three-dimensional structure of the subject with more accuracy.

The image data generating unit 320 generates three-dimensional reconstruction image data of the subject by distributing the gray-scale image acquired from the external, around the corresponding part of the outline which is shown by the shape data which the shape simulating unit 260 calculated, and outputs the generated three-dimensional reconstruction image data to the outputting unit 360. For example, an image data generating unit 320 generates the three-dimensional gray-scale image by distributing densities of the gray-scale image evenly only over the area which is in a predetermined range from the part of the outline.

Here, false information does not arise because the image data generating unit 320 generates three-dimensional reconstruction image data of the subject, without going through processes of spreading and integrating the gray-scale image, within the captured angle.

The outputting unit 360 outputs the shape data by the shape simulating unit 260, the three-dimensional reconstruction image data by the image data generating unit 320, and the three-dimensional reconstruction image data by the data processing unit 300 to an external printer or external display and the like.

Returning to FIG. 1, the shading unit 122 of the first displaying unit 120 generates the simulated three-dimensionally shaped model image by shading the three-dimensional reconstruction image computed by the three-dimensional image generating unit 200, and causes the displaying apparatus 800 to display the generated simulated three-dimensionally shaded model image, being rotated on the display. As the shading method, there is a method of drawing tangential lines on an object in an image from an virtual light source and increasing the density of a portion in an opposite side of the virtual light source, bounded by contacts of the object and the tangential lines. Alternatively, the density increases gradually.

The angle specification unit 124 of the first displaying unit 120 outputs an instruction to the shading unit 122 in order to insrtruct the angle of rotation of the simulated three-dimensionally shaded model image.

That is, the first displaying unit 120 causes the displaying apparatus 800 to display the rotating simulated three-dimensionally shaded model image by outputting the angle of the simulated three-dimensionally shaded model image to the displaying apparatus 800, where the angle being changed continuously and the shading unit 122 following the instruction of the angle specification unit 124.

The second displaying unit 140 displays the rotating 3D image of the substance acquired by the experimental structural analysis synchronizing with the simulated three-dimensionally shaded model image.

For example, the second displaying unit 140 displays the rotating 3D image of the substance by displaying the shaded two-dimensional images of the substance sequentially in order of the angle, the images being captured from a plurality of angles. Thereby, it becomes possible to display the three-dimensional structure of the substance using the gray-scale image taken with a transmission electron microscope, which is an example of the two-dimensional image.

Moreover, when th plurality of shaded two-dimensional image of the substance are to be displayed sequentially in the order of the angle, the first displaying unit 120 makes displaying angle of the simulated three-dimensionally shaded model image be the capturing angle of the two-dimensional image displayed by the second displaying unit 140. Specifically, the angle specification unit 124 has the capturing angle of the two-dimensional angle input fro a keyboard etc., and the second displaying unit 140 acquires the angle data with the two-dimensional image, and outputs the angle data to the angle specification unit 124. For example, the two dimensional image is a projection image taken with the transmission electron microscope.

In addition, according to the configuration shown in FIG. 1, the three-dimensional structure verification supporting apparatus 100 is an apparatus for supporting the verification of an artificial three-dimensional structure by verifying properness of the three-dimensional reconstruction image computed from the gray-scale image data. Alternatively, instead of computing the three-dimensional reconstruction image from the gray-scale image data, the three-dimensional structure verification supporting apparatus 100 has a configuration where the tree-dimensional simulated image, which is an image of the model made by the simulation based on circumstantial evidences, is acquired by the shading unit 122 directly. Thereby, the three-dimensional structure verification supporting apparatus 100 becomes the apparatus for supporting the verification of the properness of the three-dimensional structure of an inferential model. In this case, the three-dimensional structure verification supporting apparatus 100 omits the three-dimensional image generating unit 200.

Figure 4:
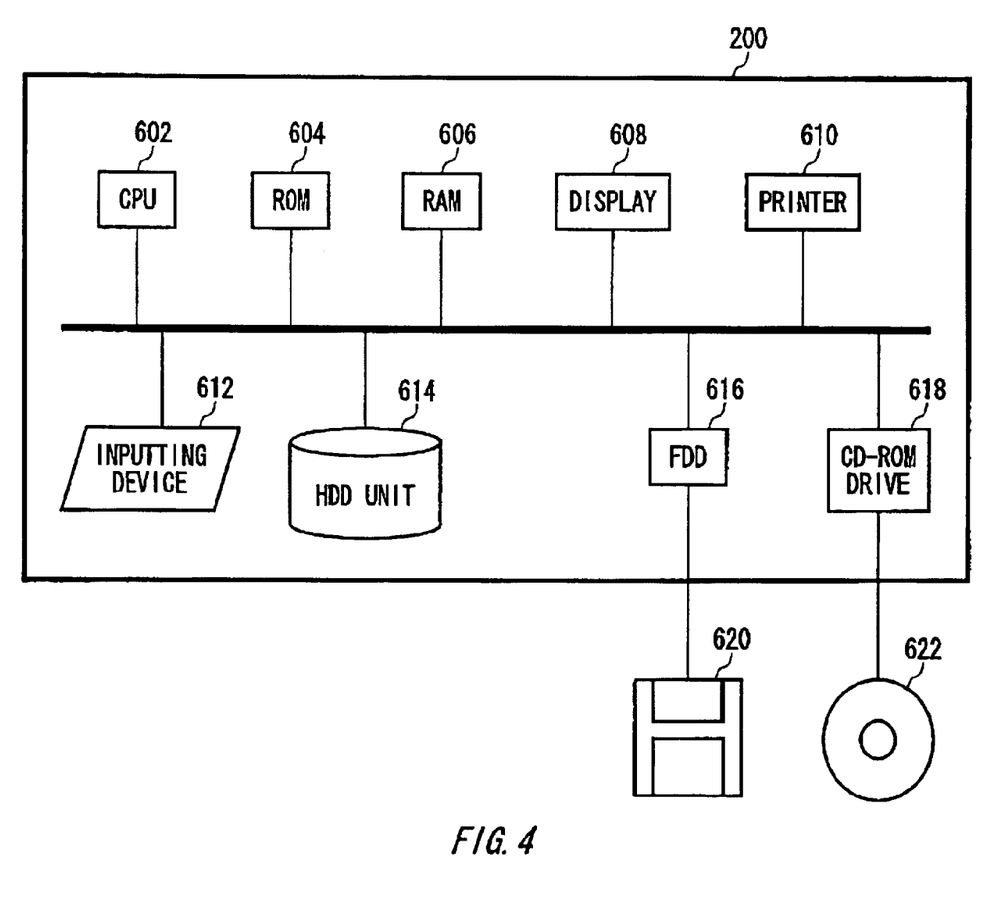
FIG. 4 is a block diagram exemplary showing a hardware configuration of the three-dimensional image generating unit 200.

FIG. 4 is a block diagram exemplary showing a hardware configuration of the three-dimensional image generating unit 200. In the present embodiment, the three-dimensional image generating unit 200 includes CPU (central processing unit) 602, ROM (read only memory) 604, RAM (random access memory) 606, a display 608, a printer 610, an inputting device 612, a hard disk drive unit 614, FD (or floppy diskette) drive 616, and CD-ROM (compact disk ROM) drive 618.

The CPU 602 executes processing based on a program stored in the RAM 606 and the ROM 604. The display 608 displays various data. The printer 610 prints various data. The inputting device 612 inputs setting etc., to the three-dimensional image generating unit 200. The FD drive 616 reads data or a program in a floppy disk 620, and transfers it to the CPU 602. The CD-ROM drive 618 reads data or a program in CD-ROM 622, and transfers it to the CPU 602. The hard disk 614 stores the data or the program read by the FD drive 616 or the CD-ROM drive 618 and also stores the data composed by the CPU 602 executing the program, reads the stored data and the program, and transfers it to the CPU 602.

In this example, a functional unit of the above-mentioned three dimensional image generating unit 200 is realized by reading the program from the CD-ROM 622, in which the program for realizing each functional unit of the above-mentioned three dimensional image generating unit 200 is stored, installing the program into the hard disk 618, and by the CPU 602 reading the program from the hard disk 618 and executing it.

More specifically, the above-mentioned program includes: a shading module for realizing the shading unit 122; an angle specification module for realizing the angle specification unit 124; a second displaying module for realizing the second displaying unit; a distribution module for realizing the distributing unit 220; a second integrating module for realizing the second integrating unit 240; a shape simulating module for realizing the shape simulating unit 260; a first integrating module for realizing the first integrating unit 280; a data processing module for realizing the data processing unit 300; an image data generating module for realizing the image data generating unit 320; and an outputting module for realizing the outputting unit 360. Since the operation of the modules is the same as that of the corresponding functional units, the explanation will be omitted. Alternatively, the above-mentioned program is not stored in the CD-ROM 622 but in the floppy disk 620 or another recording medium, such as MO or MD.

Next, a first operational example of the three-dimensional image generating unit 200 will be explained in relation to FIG. 5 to FIG. 12. In the present embodiment, two hemispherical subjects 400 arranged parallel and upward are captured by a projection image capturing apparatus, and the three-dimensional reconstruction image is generated using the three-dimensional image generating unit 200.

Figure 5:
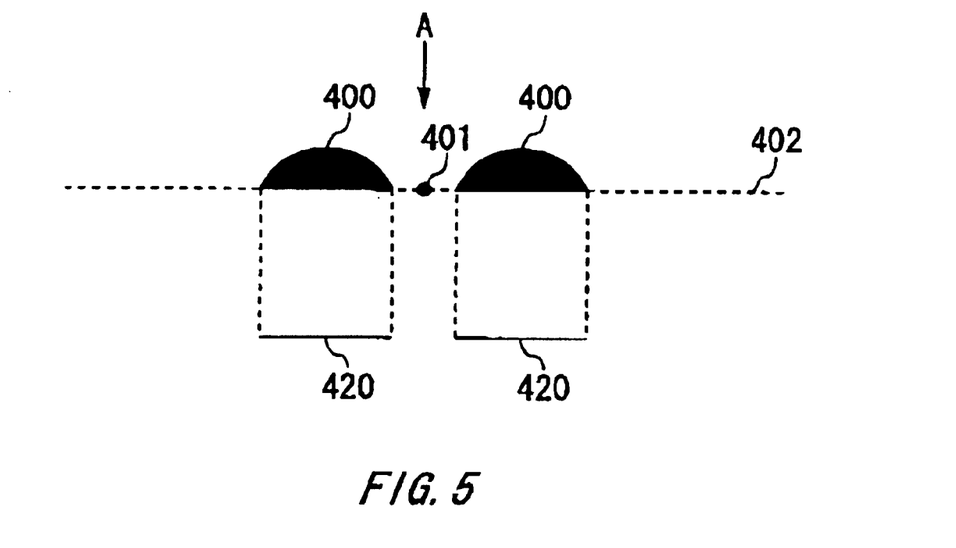
FIG. 5 is a drawing explaining how to acquire gray-scale image.
Figure 6:
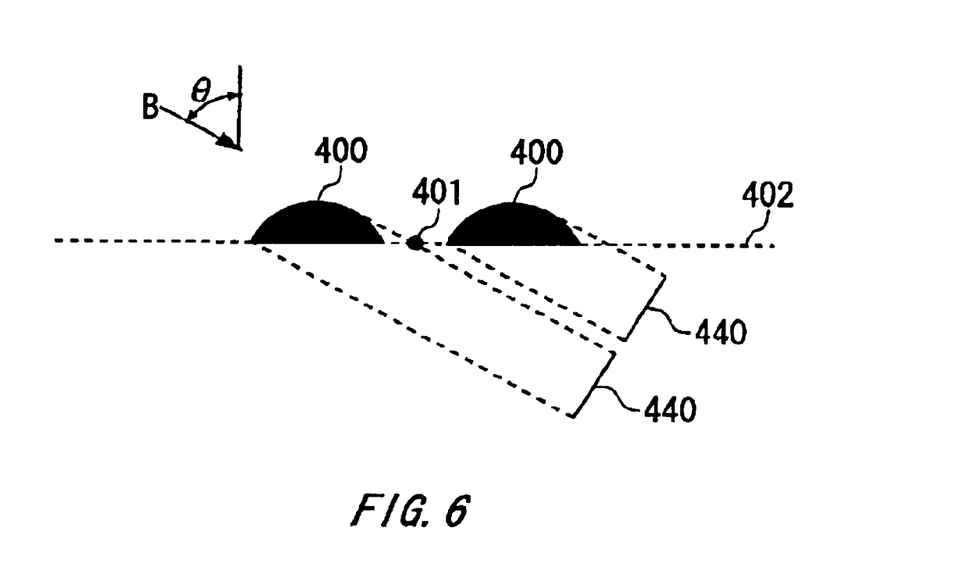
FIG. 6 is a drawing explaining how to acquire the gray-scale image.
Figure 7:
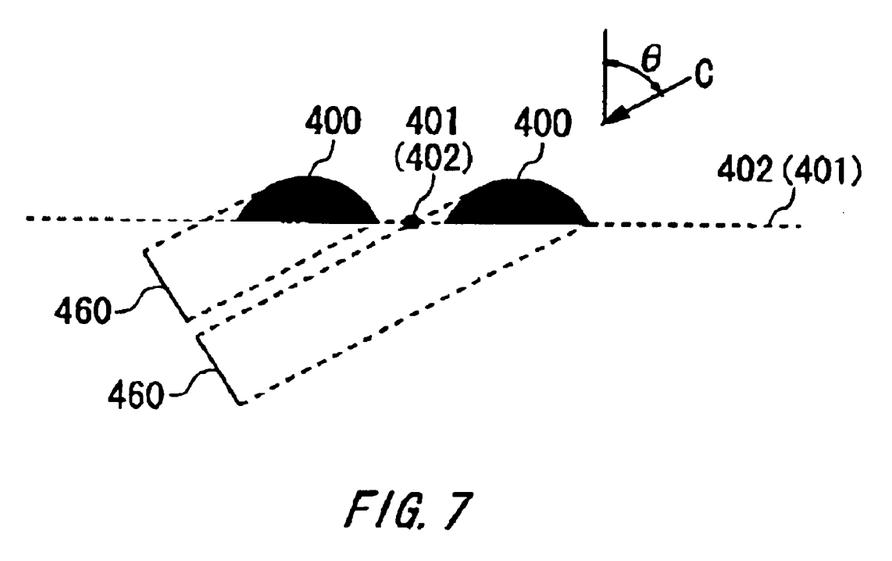
FIG. 7 is a drawing explaining how to acquire the gray-scale image.

First, a step of acquiring the gray-scale image will be explained, As shown in FIG. 5, FIG. 6 and FIG. 7, the subjects are captured from at least three different angles (direction A, direction B, and direction C in the present embodiment), and projection image data 420, 440, and 460, i.e., the gray-scale images, are acquired. Here, as shown in FIGS. 5 and 6, it is preferable to let an angle between the direction A and the direction B and an angle between the direction B and the direction C be θ.

Alternatively, the direction B and the direction C are angles rotated from the direction of the direction A on a same axis 401, or angles rotated from the direction of the direction A on different axes 401 and 402 respectively.

Then, the gray-scale images 420, 440, and 460 are input into the three-dimensional image generating unit 200. Here, the gray-scale images 420, 440, and 460 serve also as the first image data.

In the present embodiment, the distributing unit 220 of the three-dimensional image generating unit 200 extends each of the gray-scale images 420, 440, and 460 in the direction of the image capturing, generates the gray-scale density-distribution 425, 445, and 465, and the second integrating unit integrates the gray-scale density-distribution 425, 445, and 465, with the angle being maintained, and generates the three-dimensional gray-scale data.

Figure 8:
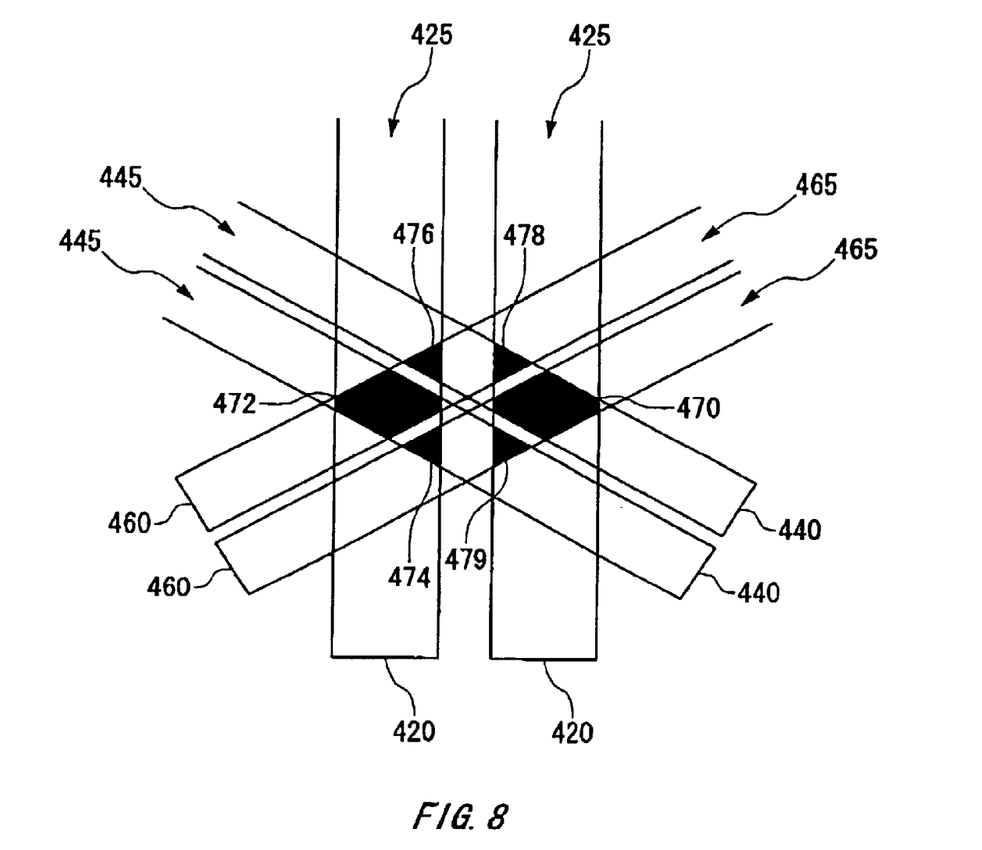
FIG. 8 is a drawing showing longitudinal section data, which is an example of three-dimensional gray-scale data.

FIG. 8 is a drawing exemplary showing longitudinal section data of the three-dimensional gray-scale data in the present embodiment. The three-dimensional gray-scale data indicates that an object exists at a portion where all of the gray-scale density-distribution are integrated. FIG. 7 shows that the subjects 400 exists at the portion where all of the gray-scale density-distribution 425, 445, and 465 are integrated, i.e., data 470, 472, 474, 476, and 478. However, the number of the subjects 400 is two and three of the five data are the false information.

Figure 9:
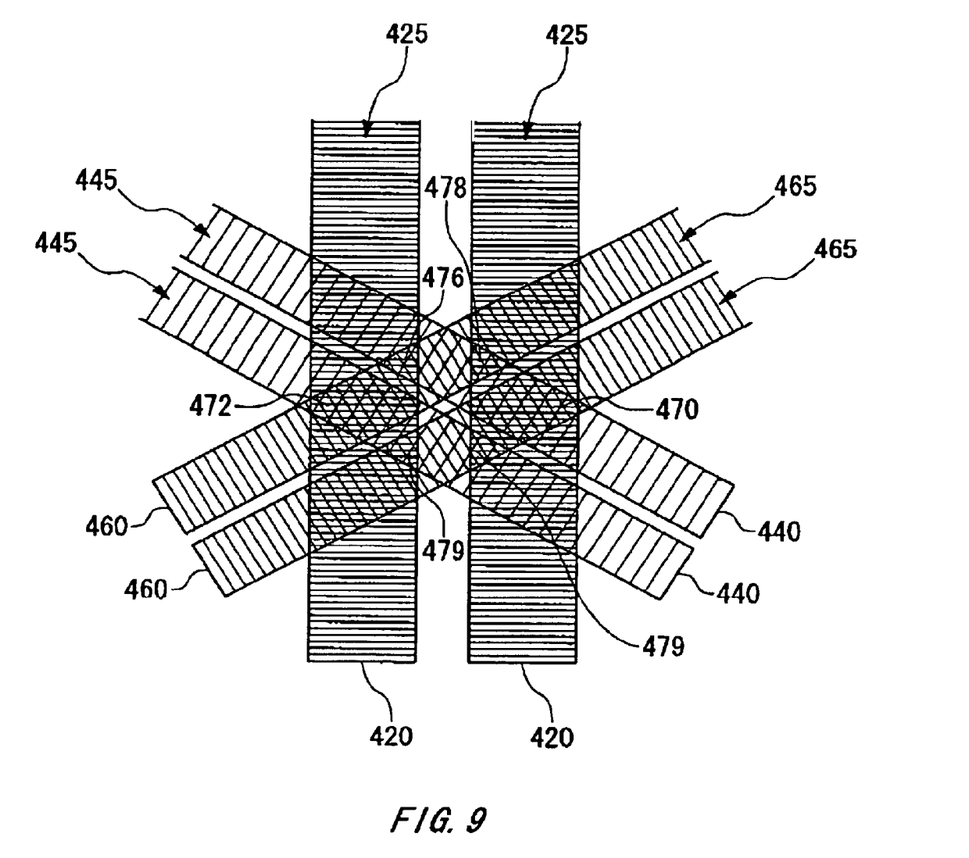
FIG. 9 is a drawing showing another examples of the longitudinal section data of the three-dimensional gray-scale data.

FIG. 9 shows another example of the longitudinal section data of the three-dimensional gray-scale data in the present embodiment. In this example, the densities of the gray-scale image 420, 440, and 460 are different from one another. Moreover, the gray-scale density-distribution 425, 445, and 465 are data being extended at the angle at which the gray-scale of the gray-scale images 420, 440, and 460 are captured and distributed uniformly. In this case, since portions other than the data 470 to 478 may also have the same or higher density as/than that of one of the data 470 to 478, the number of false information may increase further.

Moreover, the shape simulating unit 260 of the three-dimensional image generating unit 200 simulates the shape data 265 indicating the outline of the subjects 400 from the gray-scale images 420, 440, and 460. Here, the shape simulating unit 260 cannot simulate the whole outline of the subjects 400, and only a portion commonly included in visual fields of the direction A, the direction B, and the direction C in the drawing is simulated. In this example, an outline is simulated only for a spherical unit of the subjects 400.

Then, the first integrating unit 280 of the three-dimensional image generating unit 200 integrates the shape data by the shape simulating unit 260 on the three-dimensional gray-scale image.

Figure 10:
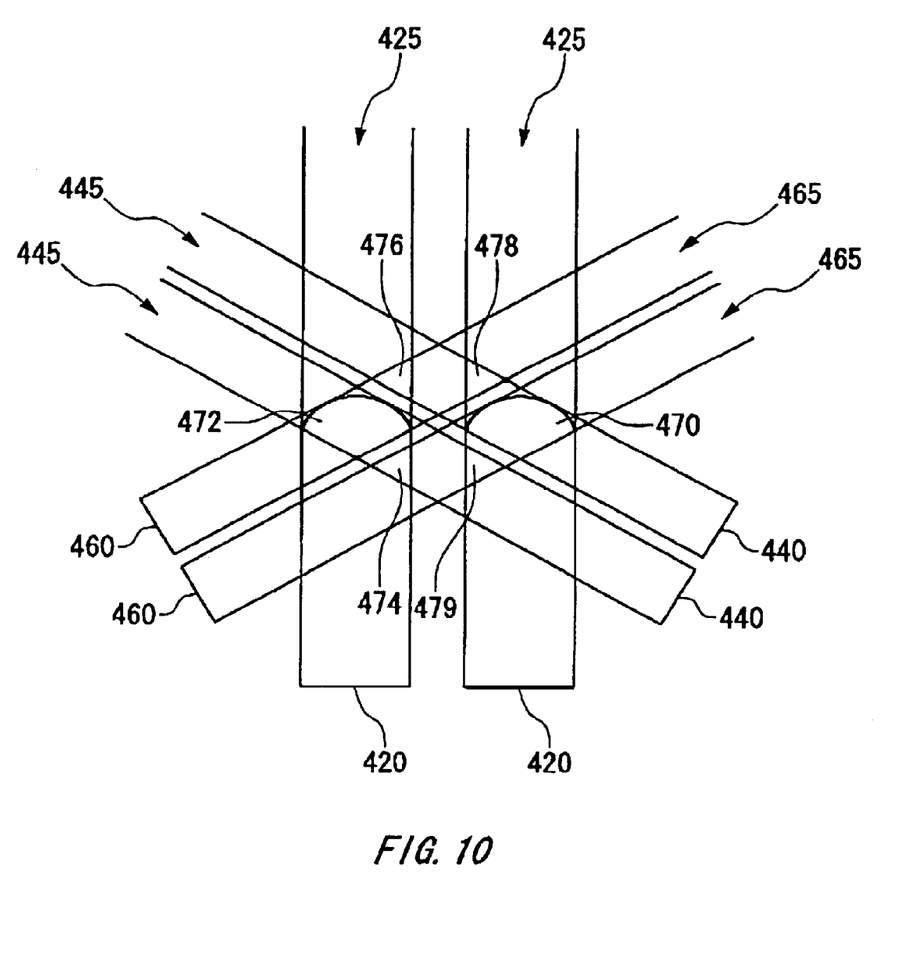
FIG. 10 is a drawing showing longitudinal section data of an example of an integrated image by a first integrating unit 280.

FIG. 10 is a drawing showing the longitudinal section data of the integration image by the first integrating unit 280 in the present embodiment. In this example, two shape data 265 by the shape simulating unit 260 are integrated on data 470 and 472 respectively. Therefore, the data processing unit 300 determines that the data 470 and 472 are the true data indicating the object, and data 474, 476 and 478 are the false information, extracts only the data 470 and 472, and outputs them to the outputting unit 360 as the three-dimensional reconstruction image.

Consequently, the false information is excluded from the three-dimensional reconstruction image.

Here, when reliability of the shape data 265 is high, the data processing unit 300 outputs the three-dimensional reconstruction image considering the shape data 265. Moreover, when the focus of the gray-scale density-distribution 425, 445, and 465 is not clear or the like, a boundary of the data 470 and a boundary of the data 472 do not become clear. In this case, the data processing unit 300 lets data, which exists within a predetermined distance from the shape data 265, be the data 470 and 472.

Alternatively, a person substitutes the operation of the data processing unit 300 by displaying the integration data by the first integrating unit 280 on a display etc., and the false information is removed by adding a judgment of a person to the three-dimensional reconstruction image by the data processing unit 300. In this case, the false information is removed more in line with circumstances.

Figure 11:
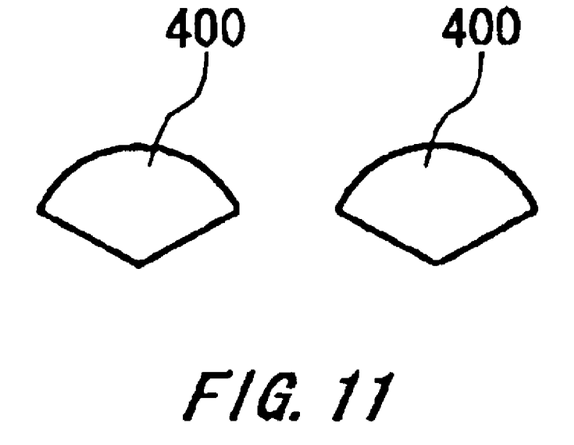
FIG. 11 is a longitudinal section exemplary showing a three-dimensional reconstruction image by a data processing unit 300.

FIG. 11 is a drawing showing a longitudinal section of the three-dimensional reconstruction image by the data processing unit 300 in the present embodiment. It is captured that the three-dimensional reconstruction image by the data processing unit 300 reproduces the subjects 400 accurately.

Then, according to need, the outputting unit 360 outputs the shape data 265 by the shape simulating unit 260 and the three-dimensional reconstruction image by the data processing unit 300, i.e., the data 470 and the data 472, to the displaying apparatus or the printer.

That is, in the first operational example, the three-dimensional image generating unit 200 acquires a more accurate three-dimensional reconstruction image using the distributing unit 220, the second integrating unit 240, the shape simulating unit 260, the first integrating unit 280, and the data processing unit 300.

Next, a second operational example of the three-dimensional image generating unit 200 will be explained using FIGS. 12 and 13. In this example, the three-dimensional image generating unit 200 acquires the three-dimensional reconstruction image of the subjects 400 using the gray-scale images 420, 440, and 460 like the first operational example.

Figure 12:
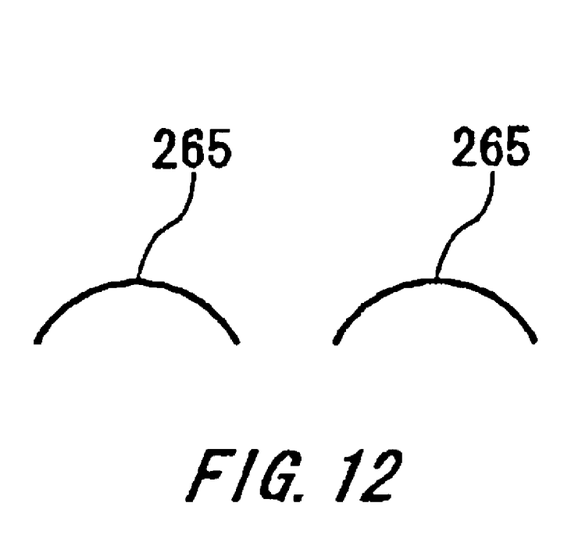
FIG. 12 is a drawing explaining a second operational example of the three-dimensional image generating unit 200.
Figure 13:
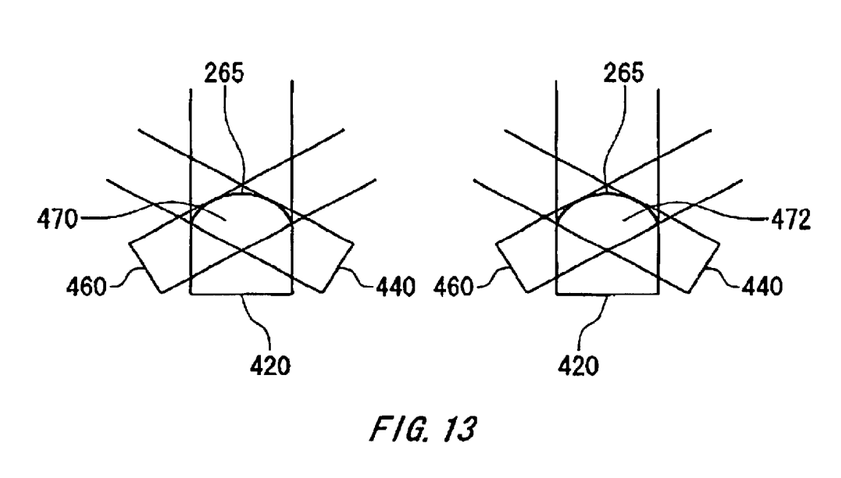
FIG. 13 is a drawing explaining the second operational example of the three-dimensional image generating unit 200.

First, as shown in FIG. 12, the shape simulating unit 260 computes the shape data 265. Then, as shown in FIG. 13, the image data generating unit 320 distributes the gray-scale images 420, 440, and 460 only over the circumference of the shape data 265, and lets a portion, where all of three gray-scale image are integrated, i.e., the data 470 and 472, be the three-dimensional reconstruction image. Consequently, the false information is excluded from the three-dimensional reconstruction image.

Here, when the reliability of the shape data 265 is high, the image data generating unit 320 outputs the three-dimensional reconstruction image considering the shape data 265. Moreover, when the boundary of the data 470 and the boundary of the data 472 are not clear, the image data generating unit 320 lets the data, which exists within a predetermined distance from the shape data 265, be the data 470 and 472. Here, when the reliability of the shape data 265 is high, the image data generating unit 320 outputs the three-dimensional reconstruction image considering the shape data 265. Moreover, when the focus of the gray-scale density-distribution 425, 445, and 465 is not clear, the boundary of the data 470 and the boundary of the data 472 are not clear. In this case, the image data generating unit 320 lets the data, which exists within a predetermined distance from the shape data 265, be the data 470 and 472. For example, when a thickness of the subjects 400 is known as D, density data of the gray-scale images 420, 440, and 460 are uniformly distributed within limits of the thickness D from the outline. At this time, it is more preferable that the above-mentioned gray-scale data are distributed in the projection direction within the limits of the thickness D.

That is, in the second operational example, the three-dimensional image generating unit 200 acquires a more accurate three-dimensional reconstruction image using the shape simulating unit 260 and the image data generating unit 320.

The three-dimensional image generating unit 200 exhibits the above-mentioned effect in particular when the capturable angle is limited.

For example, in case of letting the image data acquired from the transmission electron microscope be the projection image data, although the capturable angle is limited, it becomes possible to clarify the three-dimensional structure of the subject on a molecule scale by the three-dimensional image generating unit 200.

As a detailed example, there is a case where it is desired to clarify structure of protein of a cell and its change. In this case, by capturing a type of the protein acquired by a so-called quick-frozen, deep-etch and replica method by the transmission electron microscope and processing it in the three-dimensional image generating unit 200, the three-dimensional data indicating the three-dimensional structure of the protein as the subject, where the false information, i.e., so-called ghost, is removed, is acquirable.

Figure 14:
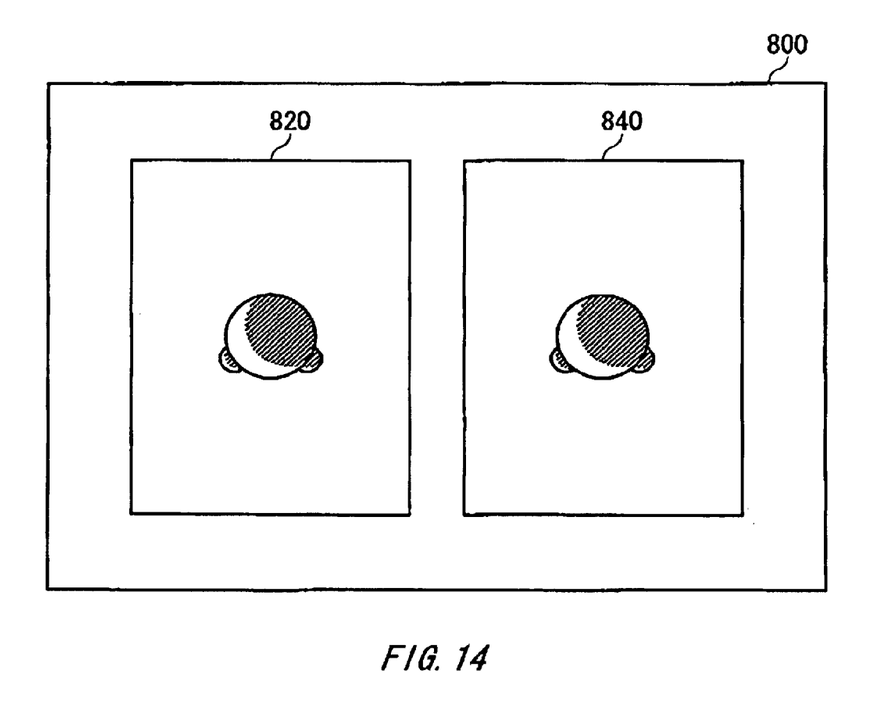
FIG. 14 is a drawing exemplary showing a display of a displaying apparatus 800 of the three-dimensional structure verification supporting apparatus 100.

FIG. 14 is a drawing exemplary showing the display of the displaying apparatus 800 of the three-dimensional structure verification supporting apparatus 100. In this example, a display image 820 is a display image by the first displaying unit 120, i.e., the simulated three-dimensionally shaded model image, and a display image 840 is a display image by the second displaying unit 140, i.e., the image acquired by the experimental structural analysis. As shown in FIG. 14, according to the three-dimensional structure verification supporting apparatus 100, since the simulated three-dimensionally shaded model image and the image acquired by the experimental structural analysis are displayed side by side with the images rotating on the screen, the two rotating images can be compared easily. Therefore, the three-dimensional structure is verified more easily.

Although the present invention has been described by way of exemplary embodiments, it should be understood that many changes and substitutions may be made by those skilled in the art without departing from the spirit and the scope of the present invention which is defined only by the appended claims.

Industrial Applicability

As apparent from the above description, according to the present invention, it is possible to provide the three-dimensional structure verification supporting apparatus, the three-dimensional structure verification method, the recording medium, and the program suitable for supporting the verification of the properness of the three-dimensional simulated images, such as the presumed model of the structure of a substance or the three-dimensional reconstruction image.

What is claimed is:

1. A three-dimensional structure verification supporting apparatus for supporting verification of an artificial three-dimensional structure by verifying properness of a three-dimensional simulated image simulated in order to indicate a three-dimensional structure of a substance, comprising:

a first displaying unit for displaying a simulated three-dimensionally shaded model image assumingly indicating the three-dimensional structure of the substance by shading the three-dimensional simulated image; and a second displaying unit for displaying the three-dimensional image of the substance acquired by experimental structural analysis, wherein the simulated three-dimensionally shaded model image and the experimental image rotate synchronously.

2. The three-dimensional structure verification supporting apparatus as claimed in claim 1, wherein said second displaying unit displays the substance rotationally as if three-dimensional model rotates by sequentially displaying a plurality of shaded two-dimensional images in order of angle as the image, the images being acquired from a plurality of angles.

3. The three-dimensional structure verification supporting apparatus as claimed in claim 2, wherein the two-dimensional images are gray-scale images acquired by a transmission electron microscope.

4. The three-dimensional structure verification supporting apparatus as claimed in claim 1, wherein the simulated three-dimensionally shaded model image is acquired by processing a plurality of gray-scale image acquired by a transmission electron microscope.

5. The three-dimensional structure verification supporting apparatus as claimed in claim 3, further comprising a three-dimensional image generating unit comprising:

a shape simulating unit for simulating shape data indicating an outline of the substance using a plurality of first image data of the substance captured from a plurality of angles;

a distributing unit for generating gray-scale density-distribution by extending density indicated in the gray-scale image to an angle by which the gray-scale image is captured, and distributing the density;

a second integrating unit for generating a three-dimensional gray-scale data which indicates the substance by three-dimensional image data by integrating the plurality of gray-scale density-distribution by the plurality of gray-scale image acquired from a plurality of angles;

a first integrating unit for integrating the three-dimensional gray-scale data by the second integrating unit on the shape data; and a data processing unit for generating the three-dimensional image by extracting only the gray-scale data existing in circumference of a shape indicated by the shape data among the three-dimensional gray-scale data.

6. The three-dimensional structure verification supporting apparatus as claimed in claim 3, further comprising a three-dimensional image generating unit comprising:

a shape simulating unit for simulating shape data indicating an outline of the substance using a plurality of first image data of the substance captured from a plurality of angles; and an image data generating unit for generating a three-dimensional simulated image by distributing the gray-scale data of the gray-scale image around the outline.

7. A three-dimensional structure verification method of verifying a three-dimensional structure by verifying a three-dimensional simulated image simulated in order to indicate a three-dimensional structure of a substance, comprising steps of:

displaying an simulated three-dimensionally shaded model image, which is a shaded image of the three-dimensional simulated image, and an image acquired by an experimental structural analysis, with the images rotating synchronously; and verifying a three-dimensional structure by comparing the simulated three-dimensionally shaded model image with the experimental image.

8. The three-dimensional structure verification method as claimed in claim 7, whereby the image of the substance is displayed rotationally as if three-dimensional model rotates by sequentially displaying a plurality of shaded two-dimensional images in order of angle as the image, the images being acquired from a plurality of angles.

9. The three-dimensional structure verification method as claimed in claim 8, whereby the two-dimensional images are gray-scale images acquired by a transmission electron microscope.

10. The three-dimensional structure verification method as claimed in claim 7, whereby the simulated three-dimensionally shaded model image is acquired by processing a plurality of gray-scale image acquired by a transmission electron microscope.

11. The three-dimensional structure verification method as claimed in claim 7, further comprising steps of:

simulating shape data indicating an outline of the substance using a plurality of first image data of the substance captured from a plurality of angles;

generating gray-scale density-distribution by extending density indicated in the gray-scale image of the substance acquired by a projection image capturing apparatus to an angle by which the gray-scale image is captured, and distributing the density;

generating three-dimensional gray-scale data which indicates the substance by three-dimensional image data by integrating the plurality of gray-scale density-distribution by the plurality of gray-scale image acquired from a plurality of angles;

integrating the three-dimensional gray-scale data of the shape data; and generating the three-dimensional simulated image by extracting only the gray-scale data existing in circumference of an outline indicated by the shape data among the three-dimensional gray-scale data.

12. The three-dimensional structure verification method as claimed in claim 7, further comprising steps of:

simulating shape data indicating an outline of the substance using a plurality of first image data of the substance captured from a plurality of angles; and generating a three-dimensional simulated image by distributing the gray-scale data of the gray-scale image around the outline.

13. A recording medium storing thereon a program for supporting verification of an artificial three-dimensional structure by verifying a three-dimensional simulated image simulated in order to indicate a three-dimensional structure of a substance, wherein the program comprises:

a first displaying module for displaying an simulated three-dimensionally shaded model image, which is a shaded image of the three-dimensional simulated image; and a second displaying module for displaying the image of the substance acquired by experimental structural analysis, and the simulated three-dimensionally shaded model image and the experimental image rotate synchronously.

14. The recording medium as claimed in claim 13, wherein the program further comprises:

a shape simulating module for simulating shape data indicating an outline of the substance using a plurality of first image data of the substance captured from a plurality of angles;

a distribution module for generating gray-scale density-distribution by extending density indicated in the gray-scale image acquired by a transmission electron microscope to an angle by which the gray-scale image is captured, and distributing the density;

a second integrating module for generating a three-dimensional gray-scale data which indicates the substance by three-dimensional image data by integrating the plurality of gray-scale density-distribution by the plurality of gray-scale image acquired from a plurality of angles;

a first integrating module for integrating the three-dimensional gray-scale data by the second integrating unit on the shape data; and a data processing module for generating the three-dimensional image by extracting only the gray-scale data existing in circumference of a shape indicated by the shape data among the three-dimensional gray-scale data.

15. The recording medium as claimed in claim 13, wherein the program comprises:
   a shape simulating module for simulating shape data indicating an outline of the substance using a plurality of first image data of the substance captured from a plurality of angles; and
   an image data generating module for generating a three-dimensional simulated image by distributing the gray-scale data of the gray-scale image acquired by a transmission electron microscope around the outline.

16. A program for supporting verification of an artificial three-dimensional structure by verifying a three-dimensional simulated image simulated in order to indicate a three-dimensional structure of a substance, comprising:
   a first displaying module for displaying an simulated three-dimensionally shaded model image, which is a shaded image of the three-dimensional simulated image; and
   a second displaying module for displaying the image of the substance acquired by experimental structural analysis, wherein
   the simulated three-dimensionally shaded model image and the experimental image rotate synchronously.

17. The program as claimed in claim 16, further comprising:
   a shape simulating module for simulating shape data indicating an outline of the substance using a plurality of first image data of the substance captured from a plurality of angles;
   a distribution module for generating gray-scale density-distribution by extending density indicated in the gray-scale image acquired by a transmission electron microscope to an angle by which the gray-scale image is captured, and distributing the density;
   a second integrating module for generating a three-dimensional gray-scale data which indicates the substance by three-dimensional image data by integrating the plurality of gray-scale density-distribution by the plurality of gray-scale image acquired from a plurality of angles;
   a first integrating module for integrating the three-dimensional gray-scale data by the second integrating unit on the shape data; and
   a data processing module for generating the three-dimensional image by extracting only the gray-scale data existing in circumference of a shape indicated by the shape data among the three-dimensional gray-scale data.

18. The program as claimed in claim 16, further comprising:
   a shape simulating module for simulating shape data indicating an outline of the substance using a plurality of first image data of the substance captured from a plurality of angles; and
   an image data generating module for generating a three-dimensional simulated image by distributing the gray-scale data of the gray-scale image acquired by a transmission electron microscope around the outline.

* * * * *